(12) United States Patent
Hsu et al.

(10) Patent No.: US 11,019,742 B2
(45) Date of Patent: May 25, 2021

(54) HINGE STRUCTURE AND ELECTRONIC DEVICE HAVING THE SAME

(71) Applicants: Chia-Hao Hsu, Taipei (TW); You-Yu Chen, Taipei (TW); Chia-Huang Chan, Taipei (TW)

(72) Inventors: Chia-Hao Hsu, Taipei (TW); You-Yu Chen, Taipei (TW); Chia-Huang Chan, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/280,038

(22) Filed: Feb. 20, 2019

(65) Prior Publication Data

US 2019/0274227 A1 Sep. 5, 2019

Related U.S. Application Data

(60) Provisional application No. 62/637,390, filed on Mar. 2, 2018, provisional application No. 62/641,401, filed on Mar. 11, 2018.

(51) Int. Cl.
*H05K 5/02* (2006.01)
*F16C 11/04* (2006.01)
(Continued)

(52) U.S. Cl.
CPC ........... *H05K 5/0226* (2013.01); *E05D 3/122* (2013.01); *E05F 1/1083* (2013.01); *F16C 11/04* (2013.01);
(Continued)

(58) Field of Classification Search
CPC .............. H05K 5/0226; E05Y 2201/48; E05Y 2900/606; E05D 3/122; E05F 1/1083; F16C 11/04
See application file for complete search history.

(56) References Cited

U.S. PATENT DOCUMENTS 10,423,019 B1 * 9/2019 Song ..................... G06F 1/1652
10,563,438 B1 * 2/2020 Chen ..................... G06F 1/1681
(Continued)

FOREIGN PATENT DOCUMENTS

CN 206929195 1/2018
TW M545933 7/2017

OTHER PUBLICATIONS

"Office Action of Taiwan Counterpart Application," dated Nov. 12, 2019, p. 1-p. 4.

*Primary Examiner* — Rockshana D Chowdhury
*Assistant Examiner* — Douglas R Burtner
(74) *Attorney, Agent, or Firm* — JCIPRNET (57) ABSTRACT

A hinge structure including a plurality of pivots, a driving part, two positioning gear sets, and a plurality of fixing parts is provided. The pivots are parallel to each other. The driving part is disposed at a central portion of the pivots and is perpendicular to the pivots. These two positioning gear sets are respectively sleeved around two ends of each of the pivots. The fixing parts are respectively disposed outside these two positioning gear sets. When the plurality of fixing parts is under the action of an external force, the two gear sets are moved relative to each other, and the driving part is adapted to be bent and drives the pivots to rotate synchronously with respect to a central axis.

20 Claims, 7 Drawing Sheets

(51) Int. Cl.
*E05F 1/10* (2006.01)
*E05D 3/12* (2006.01)
(52) U.S. Cl.
CPC ..... *E05Y 2201/48* (2013.01); *E05Y 2900/606* (2013.01)

(56) References Cited

U.S. PATENT DOCUMENTS

| | | | |
|---|---|---|---|
| 2005/0050686 A1* | 3/2005 | Kurokawa | G06F 1/1681 16/354 |
| 2008/0307608 A1* | 12/2008 | Goto | G06F 1/1618 16/366 |
| 2012/0050122 A1 | 3/2012 | Wu et al. | |
| 2013/0014346 A1* | 1/2013 | Ahn | G06F 1/1681 16/354 |
| 2013/0152342 A1* | 6/2013 | Ahn | F16C 11/04 16/354 |
| 2017/0192467 A1* | 7/2017 | Holung | G06F 1/1654 |
| 2017/0275935 A1* | 9/2017 | Shang | E05D 3/122 |
| 2018/0024596 A1* | 1/2018 | Park | E05D 3/122 361/679.55 |
| 2018/0059740 A1* | 3/2018 | Kato | G06F 1/1681 |
| 2018/0324964 A1* | 11/2018 | Yoo | G06F 1/1681 |
| 2019/0040904 A1* | 2/2019 | Hsu | G06F 1/1681 |
| 2020/0173209 A1* | 6/2020 | Hsu | E05D 3/12 |

* cited by examiner

HINGE STRUCTURE AND ELECTRONIC DEVICE HAVING THE SAME

CROSS-REFERENCE TO RELATED APPLICATION

This application claims the priority benefit of U.S. provisional application Ser. No. 62/637,390, filed on Mar. 2, 2018, and U.S. provisional application Ser. No. 62/641,401, filed on Mar. 11, 2018. The entirety of each of the above-mentioned patent applications is hereby incorporated by reference herein and made a part of this specification.

BACKGROUND

Technical Field

The invention relates to a hinge structure, and more particularly to a hinge structure and an electronic device having the same.

Description of Related Art

The current electronic device includes a flexible panel and two carriers for carrying the flexible panel, and the two carriers are pivotally connected to each other through a hinge structure. In general, the flexible panel is disposed on one side of the hinge structure of the carrier. When the hinge structure begins to pivot, the two carriers are brought relatively close and the flexible panel also bends at the same time. However, the existing binding position of the carrier and the hinge structure is fixed. When the flexible panel is bent, the length of the bending portions thereof facing the carriers increases, it may be separated and misaligned from the carrier, thereby causing damages to the flexible panel.

Further, the existing improvement method adds a slide and an elastic member to the hinge structures. When the hinge structure pivots, the carriers may move along the slide to adjust a position with respect to the hinge structure, thereby adapting to a change of the length of a flexible panel as it bends. However, the abutting manner of the elastic member employed in the prior art has insufficient distribution of the applied points, it is impossible to ensure that the carriers can relatively move along the slide. When the flexible panel is in a bent state or an unfolded state, the deviation of the displacement of the carriers is likely to cause damages to the flexible panel.

SUMMARY

The invention provides a hinge structure, which can achieve the effects of synchronously moving away and synchronously approaching when it is relatively moved under a force.

The hinge structure of the invention includes a plurality of pivots, a driving part, two positioning gear sets, and a plurality of fixing parts. The plurality of pivots is disposed parallel to one another. The driving part is disposed at a central portion of the pivots and perpendicular to the plurality of pivots. Two positioning gear sets are respectively sleeved at both ends of each of the pivot. The plurality of fixing parts is respectively disposed outside the two positioning gear sets. When the plurality of fixing parts is under an external force, the two positioning gear sets are relatively moved, and the driving part is adapted to generate a bending to drive the plurality of pivots to rotate synchronously with respect to a central axis.

The invention provides an electronic device, a hinge structure thereof can achieve the effects of synchronously moving away and synchronously approaching when it is relatively moved under an external force, thereby driving two carriers relatively moving away or approaching in order to avoid a flexible panel from being damaged during the unfolding or closing process.

The electronic device of the invention includes at least one hinge structure, a housing, two carriers, and a flexible panel. The at least one hinge structure includes a plurality of pivots, a driving part, two positioning gear sets, and a plurality of fixing parts. The plurality of pivots is disposed parallel to one another. The driving part is disposed at a central portion of the plurality of pivots and perpendicular to the plurality of pivots. Two positioning gear sets are respectively sleeved at both ends of each of the pivots. The plurality of fixing parts is respectively disposed outside the two positioning gear sets. The housing is to carry the at least one hinge structure. The two carriers are respectively linked to the corresponding plurality of fixing parts. The flexible panel is disposed on the two carriers. When the plurality of fixing parts is under an external force, the two positioning gear sets drive the two carriers to relatively move, and the driving part is adapted to generate a bending to drive the plurality of pivots to rotate synchronously with respect to a central axis such that the flexible panel is relatively bent or relatively unfolded.

Based on the above, the invention provides a hinge structure and an electronic device having the same. When the hinge structure thereof is relatively moved (closed or unfolded) under an external force, the plurality of pivots rotate synchronously with respect to a central axis through the features of the driving part, while the plurality of fixing parts may achieve the effects of synchronously moving away and synchronously approaching, driving the two carriers to be relatively far apart or close so as to prevent the drawbacks of moving unsmoothly of existing hinge structures, thereby preventing the flexible panel from being damaged during the unfolding or closing process.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
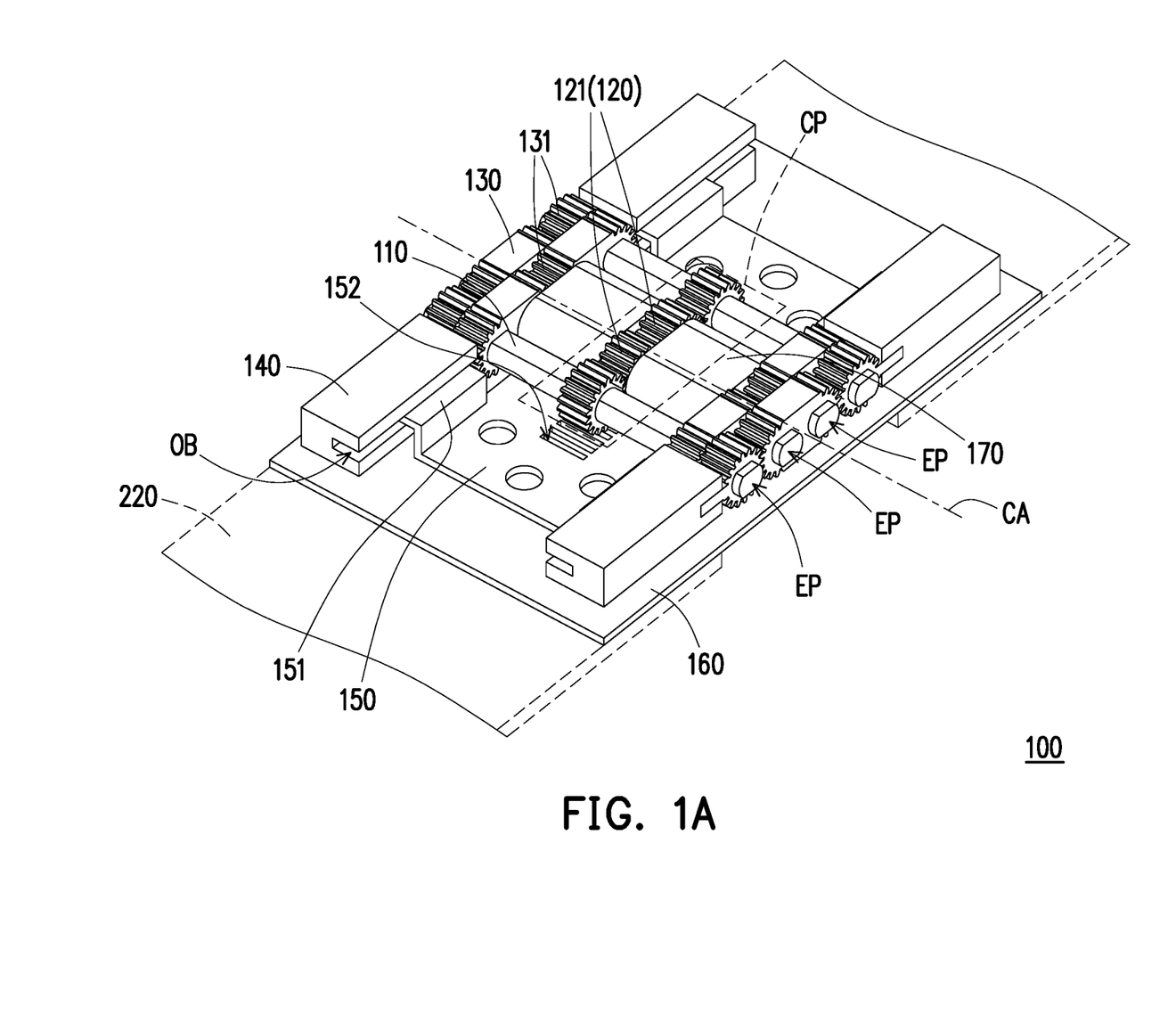
FIG. 1A is a schematic view of a flat state in which a hinge structure according to a first embodiment of the invention is in combination with two carriers.
Figure 1B:
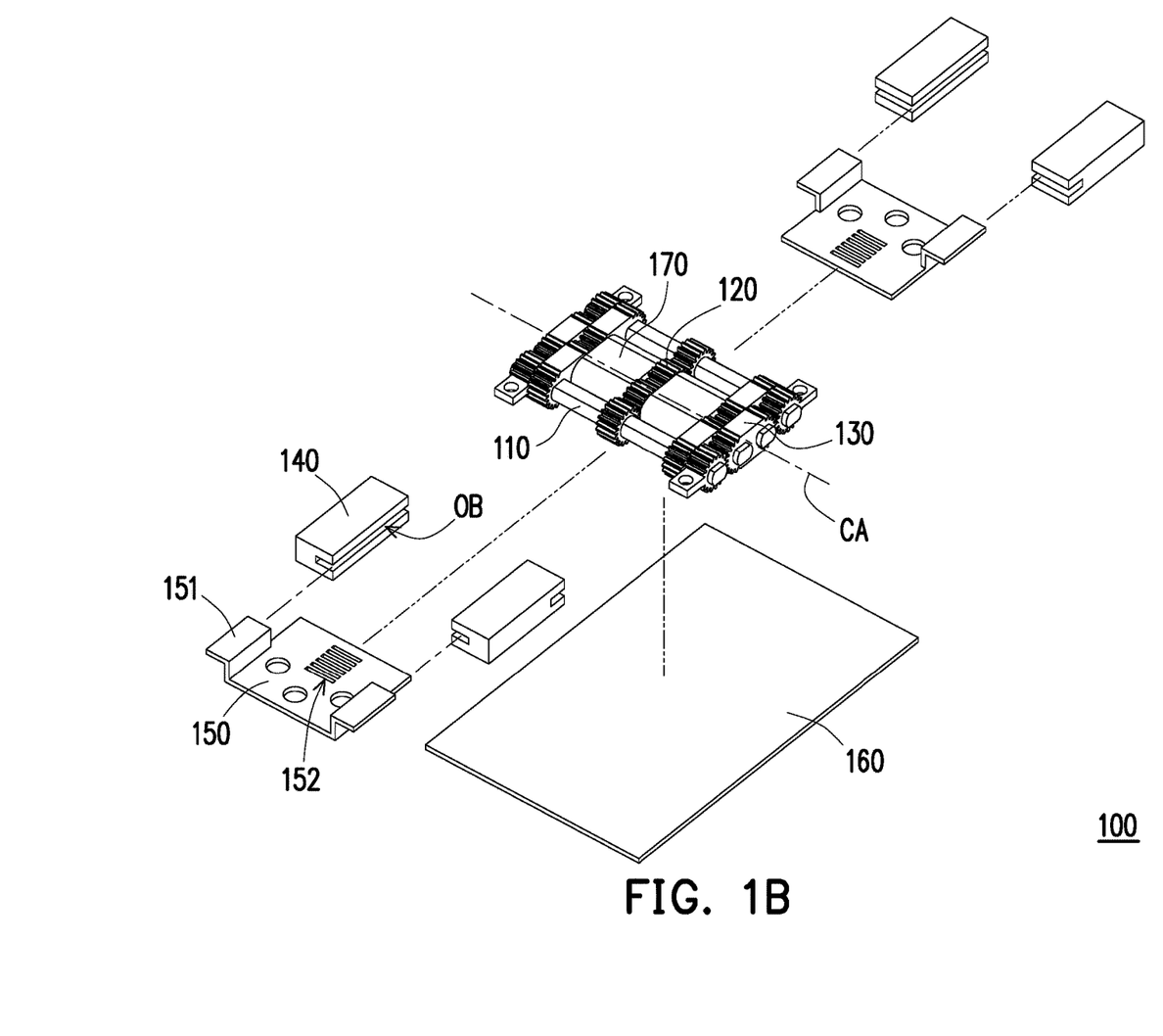
FIG. 1B is an exploded view of the hinge structure of FIG. 1A.
Figure 1C:
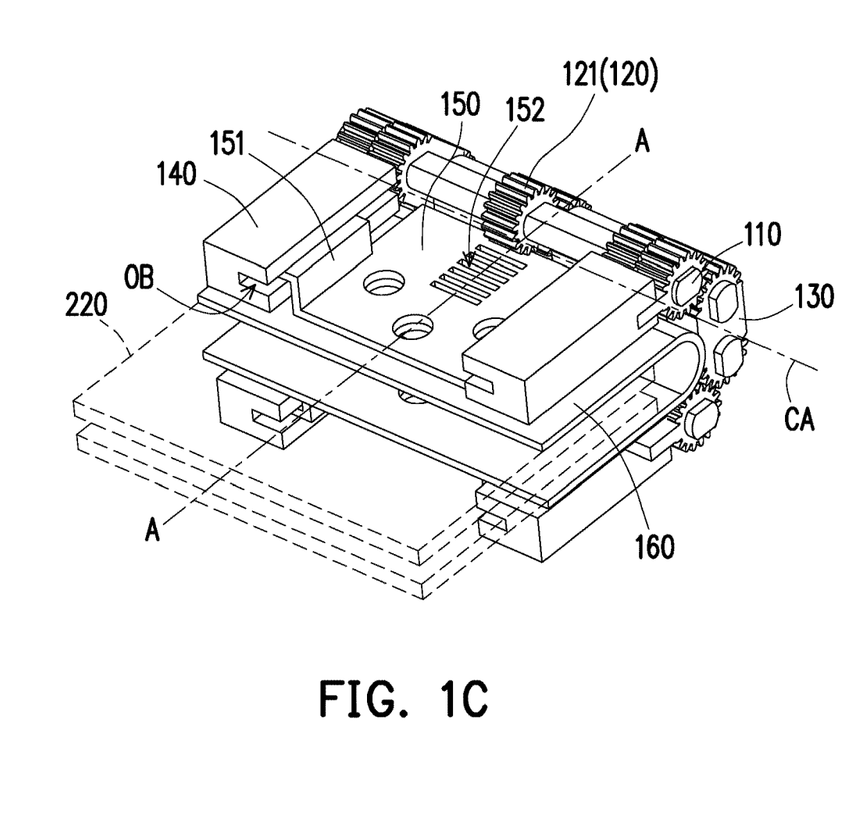
FIG. 1C is a schematic view of a bent state of the hinge structure of FIG. 1A.
Figure 1D:
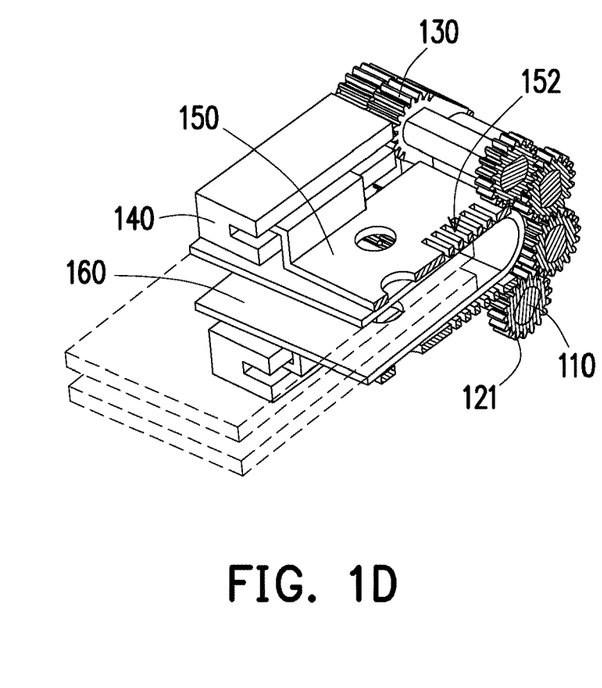
FIG. 1D is a schematic cross-sectional view along the line AA of the hinge structure of FIG. 1C.
Figure 2:
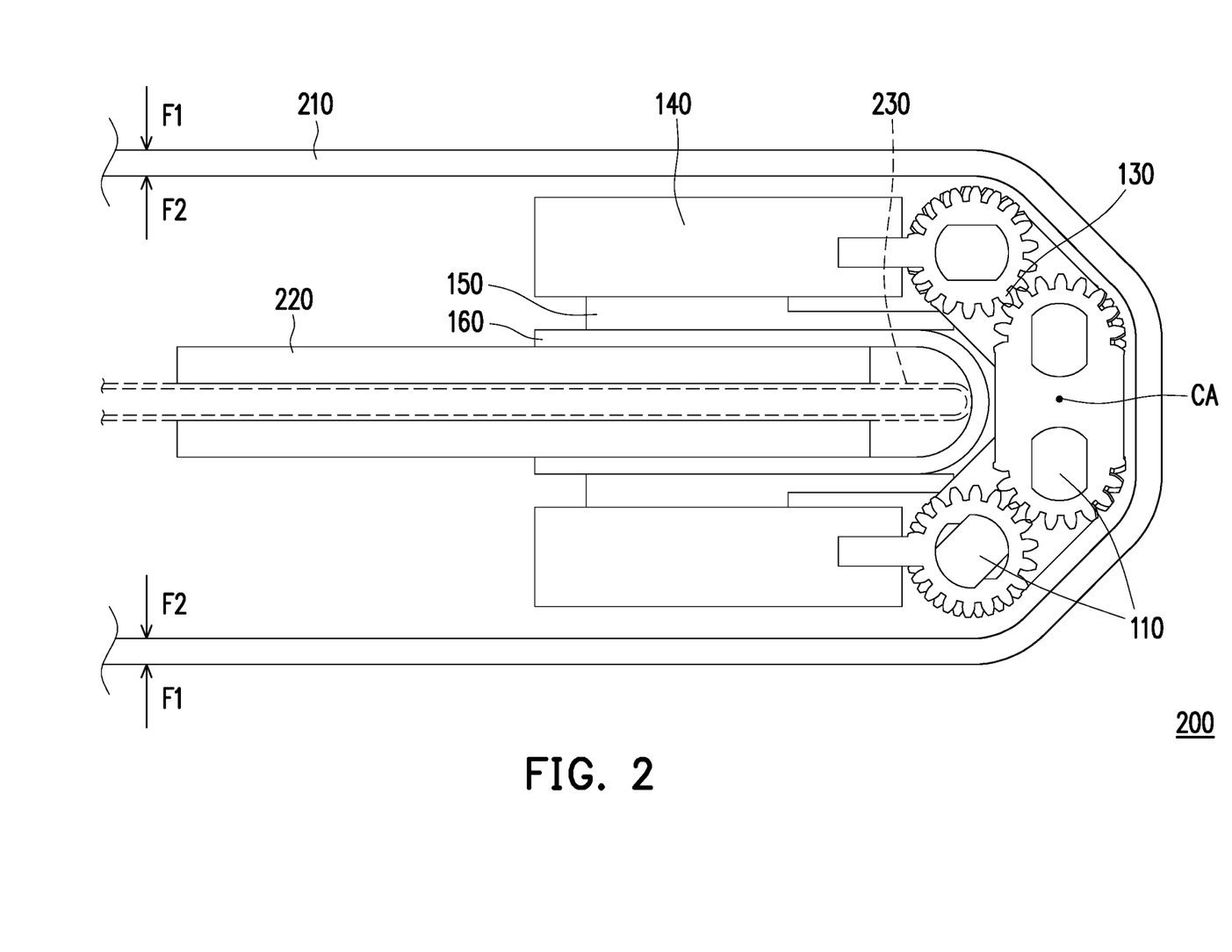
FIG. 2 is a schematic view of a bent state in which the hinged structure of FIG. 1A is in combination with two carriers, a housing, and a flexible panel.

FIG. 1A is a schematic view of a flat state in which a hinge structure according to a first embodiment of the invention is in combination with two carriers. FIG. 1B is an exploded view of the hinge structure of FIG. 1A. FIG. 1C is a schematic view of a bent state of the hinge structure of FIG. 1A. FIG. 1D is a schematic cross-sectional view along the line AA of the hinge structure of FIG. 1C. FIG. 2 is a schematic view of a bent state in which the hinged structure of FIG. 1A is in combination with two carriers, a housing, and a flexible panel.

Referring to FIG. 1A and FIG. 2, the hinge structure 100 of the invention serves to be applied in an electronic device 200, among which the electronic device 200 is for example a notebook computer, a tablet computer, or other electronic products that can be relatively closed and unfolded. The present application is exemplified by a tablet computer with a flexible panel. A hinge structure 100 is disposed at a bendable portion of the tablet computer. When the hinge structure is relatively moved by an external force, the tablet computer (electronic device 200) may be switched to an in-use state or a storage state.

The electronic device 200 of the invention includes at least one hinge structure(s) 100, a housing 210, two carriers 220, and a flexible panel 230.

Referring to FIGS. 1A to 1D, at least one hinge structure (s) 100 of the present embodiment is/are illustrated (one hinge structure is showed in the figures, but it is not limited thereto). The hinge structure 100 includes a plurality of pivots 110, a driving part 120, two positioning gear sets 130, and a plurality of fixing parts 140.

The plurality of pivots 110 is presented parallel to one another. The driving part 120 is disposed at a central portion CP of the plurality of pivots 110 and perpendicular to the plurality of pivots 110. The two positioning gear sets 130 are respectively sleeved at both ends EP of each pivot 110 and parallel to the driving part 120. The positioning gear set 130 achieves the effect of fixing a bending angle through the plurality of positioning gears 131 engaged to one another. A plurality of fixing parts 140 is respectively disposed outside the two positioning gear sets 130. Further, the number of the plurality of fixing parts 140 is, for example, four and each of the positioning gear sets 130 is provided with two fixing parts 140 disposed at both sides thereof respectively. This means that the plurality of fixing parts 140 is disposed apart from and parallel to one another.

Referring to FIG. 2, the housing 210 is made of, for example, a bendable material and is used to carry the hinge structure 100. The two carriers 220 are respectively linked to the corresponding plurality of fixing parts 140. The flexible panel 230 is disposed on the two carriers 220, and the flexible panel 230 is located on a side of the positioning gear set 130 and the fixing member 140 that is distal from the housing 210.

When the plurality of fixing parts 140 is under external forces F1, F2, for example, applying the external forces F1 approaching each other or external forces F2 moving away from each other to the housing 210, the external forces F1, F2 may be transmitted and operated on the two positioning gear sets 130, and the driving part 120 is adapted to generate a bending to drive the plurality of pivots 110 to rotate synchronously with respect to a central axis CA. In detail, the external forces F1, F2 may cause the plurality of fixing parts 140 to drive the two carriers 220 to relatively move, for example, the two carriers 220 are relatively close or relatively far apart. The flexible panel 230 is relatively bent (corresponding to the storage state of the electronic device 200) or relatively unfolded (corresponding to the in-use state of the electronic device 200) when the two carriers 220 are relatively close to each other or relatively far apart from each other.

Further, referring to FIGS. 1B to 1D, the number of the pivots 110 is an even number (exemplified by four in the drawings). The driving part 120 includes an even number of synchronizing gears 121 (exemplified by four in the drawings) respectively sleeved on the central portions CP of the corresponding plurality of pivots 110 and the plurality of synchronizing gears 121 is engaged with one another. Each synchronizing gear 121 is equally spaced from the two positioning gear sets 130. In addition, an extending direction of a tooth portion of each synchronizing gear 121 is perpendicular to the pivot 110.

In the present embodiment, the even number of the synchronizing gears 121 are adapted to drive the plurality of pivots 110 to synchronously rotate with respect to the central axis CA during the process of unfolding or closing. In detail, when the two opposite synchronizing gears 121 are relatively close (refer to FIG. 2), the plurality of pivots 110 is presented in a bent appearance (refer to FIG. 1D). When the two opposite synchronizing gears 121 are relatively far apart, the plurality of pivots 110 is presented in a straight-line appearance (refer to FIG. 1A).

Further, referring to FIGS. 1A, 1C, and 2, the hinge structure 100 includes two racks bases 150 disposed on opposite outsides of the plurality of pivots 110 and located between the corresponding plurality of fixing parts 140. Two opposite synchronizing gears 121 of the driving part 120 respectively engage corresponding rack bases 150. Each of the fixing parts 140 has a slide OB, the two rack bases 150 are movably located between the corresponding plurality of fixing parts 140 respectively, and the two opposite synchronizing gears 121 of the driving part 120 are adapted to drive the two rack bases 150 to move along a corresponding plurality of slides OB.

In addition, each of the rack bases 150 has two sliding portions 151 and a plurality of engaging holes 152, and each of the sliding portions 151 is respectively disposed through the corresponding opposite slide OB. When the hinge structure 100 is switched to the flat state, the two opposite synchronizing gears 121 synchronously engage the engaging holes 152 to drive the two rack bases 150 to be relatively close to the central axis CA. When the hinge structure 100 is switched to the bent state, the two opposite synchronizing gears 121 synchronously engage the engaging holes 152 to drive the two rack bases 150 to be relatively far apart from the central axis CA.

Referring to FIGS. 1A, 1C, and 2, the hinge structure 100 includes an elastic support plate 160 fixed on a side of the two rack bases 150 that is distal from the plurality of synchronizing gears 121. The two carriers 220 are respectively disposed at both of a left side and a right side of the elastic support plate that are distal from the central axis CA. When the two rack bases 150 are relatively far apart from the central axis CA, the elastic support plate 160 is driven to be presented in a bent state such that the two carriers 220 are close to each other. When the two rack bases 150 are relatively close to the central axis CA, the elastic support plate 160 is driven to be presented in a flat state, such that the two carriers 220 are far apart from each other. Specifically, the elastic support plate 160 is used to support the bending region of the flexible panel 230. When the flexible panel 230 is bent, the elastic support plate 160 may absorb a part of the torsional external force to improve the bending tolerance of the flexible panel 230 so as to prevent the flexible panel 230 from being damaged due to excessive bending.

Referring to FIGS. 1A and 1B, the hinge structure 100 includes at least two torsion components 170 (exemplified by two in the drawings). The two torsion components 170 are sleeved on the plurality of pivots 110 and are respectively located between the driving part 120 and the two positioning gear sets 130. The torsion components 170 are respectively in contact with the driving part 120 and the two positioning gear sets 130, thereby increasing the torsional force among the driving part 120 and the two positioning gear sets 130 while bending so as to prevent the driving part 120 and the two positioning gear sets 130 from detaching.

Figure 3:
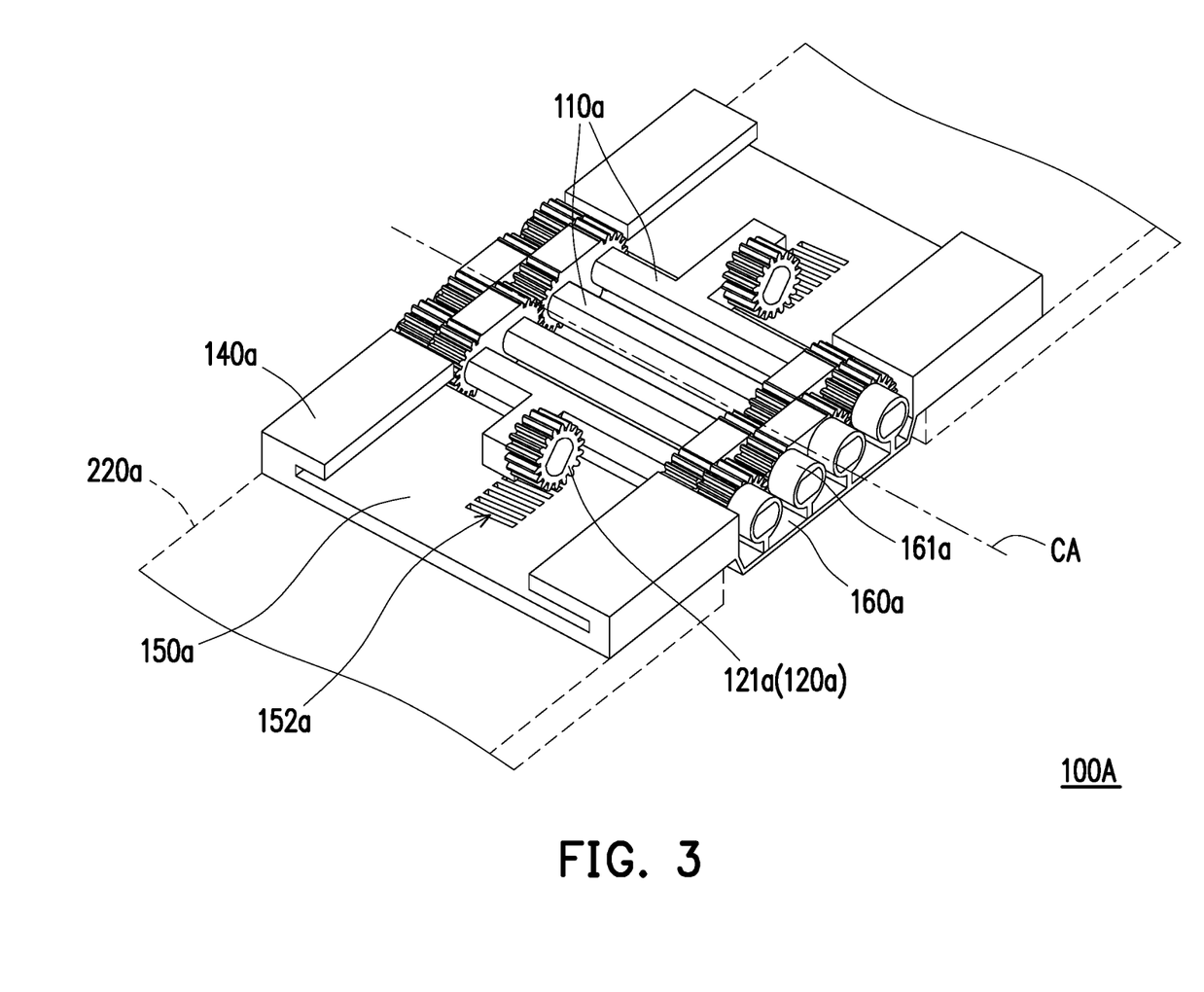
FIG. 3 is a perspective view in which a hinge structure according to a second embodiment of the invention is in combination with two carriers.

FIG. 3 is a perspective view in which a hinge structure according to a second embodiment of the invention is in combination with two carriers.

Referring to FIG. 3, the hinge structure 100A of the present embodiment is similar to the hinge structure 100 of FIG. 1A except that the hinge structure 100A has four fixing parts 140a oppositely disposed. A plurality of rack bases 150a is integrally connected to the corresponding plurality of fixing parts 140a respectively. In detail, each of the rack bases 150a is connected between the corresponding two fixing parts 140a, and the plurality of synchronizing gears 121a are adapted to drive the plurality of rack bases 150a to synchronously move with the plurality of fixing parts 140a. Further, the driving part 120a includes a plurality of synchronizing gears 121a and, for example, the number is two. The two synchronizing gears 121a are respectively disposed on the opposite pivots 110a and extend outwardly between the plurality of fixing parts 140a, thereby engaging to the plurality of engaging holes 152a of the respective rack base 150a.

The hinge structure 100A includes an elastic support plate 160a connected between the plurality of fixing parts 140a and relatively distal from the plurality of synchronizing gears 121a. Among them, the elastic support plate 160a has a plurality of collars 161a, which are linearly arranged and vertically extended, respectively sleeved at the corresponding plurality of pivots 110a, so that the elastic support plate 160a is adapted to assist in driving the plurality of pivots 110a.

In addition, the two carriers 220a are respectively disposed on the corresponding plurality of rack bases 150a and the plurality of fixing parts 140a and are respectively located on both of a left side and a right side of the elastic support plate 160a that are distal from the central axis CA. When the plurality of rack bases 150a and the plurality of fixing parts 140a are relatively far apart from the central axis CA, the elastic support plates 160a is driven to be presented in a bent state such that the two carriers 220a are close to each other. When the plurality of rack bases 150a and the plurality of fixing parts 140a are relatively close to the central axis CA, the elastic support plate 160a is driven to be presented in a flat state (refer to FIG. 3), such that the two carriers 220a are far apart from each other.

Figure 4A:
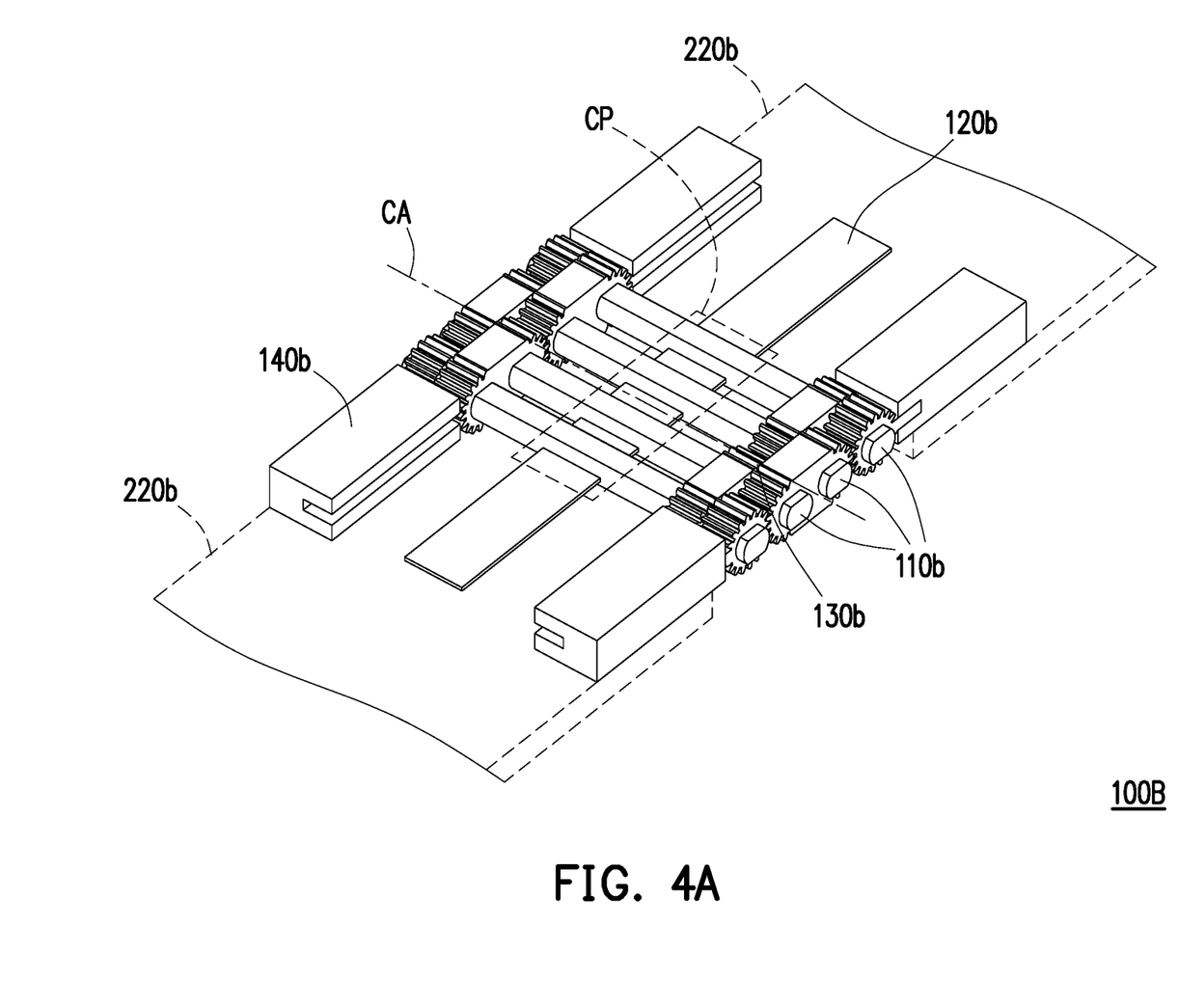
FIG. 4A is a perspective view in which a hinge structure according to a third embodiment of the invention is in combination with two carriers.
Figure 4B:
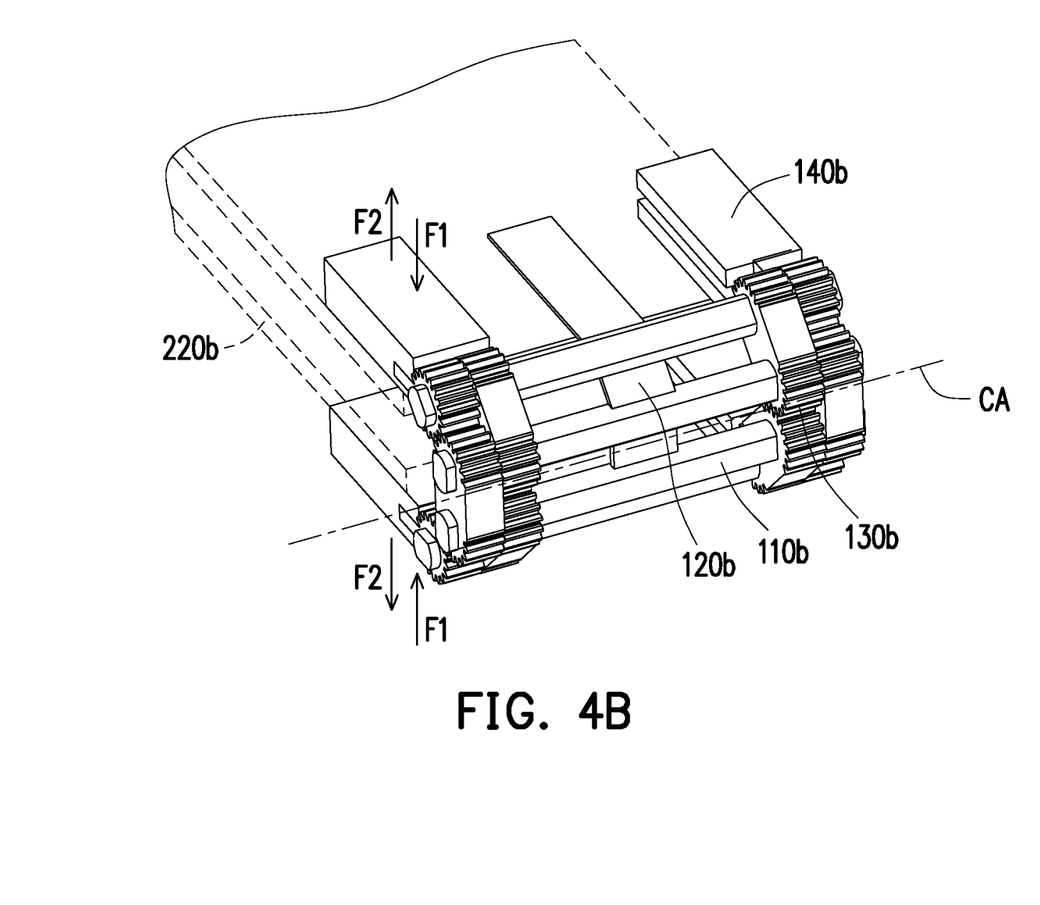
FIG. 4B is a schematic view of a bent state of the hinge structure of FIG. 4A.

FIG. 4A is a perspective view in which a hinge structure according to a third embodiment of the invention is in combination with two carriers. FIG. 4B is a schematic view of a bent state of the hinge structure of FIG. 4A.

Referring to FIGS. 4A and 4B, the hinge structure 100B of the present embodiment is similar to the hinge structure 100 of FIG. 1A except that the driving part 120b includes an elastic steel sheet disposed through a central portion CP of a plurality of pivots 110b and parallel to a plurality of positioning gear sets 130b.

In addition, the two carriers 220b are respectively disposed on the corresponding plurality of fixing parts 140b. When the two positioning gear sets 130b are under the external forces F1, F2, the elastic steel sheet is adapted to generate a bending, driving the plurality of pivots 110b to synchronously rotate with respect to a central axis CA. In detail, the external forces F1, F2 may cause the plurality of fixing parts 140b to drive the two carriers 220 to relatively move, for example, the two carriers 220b are relatively close or the two carriers 220b are relatively far apart.

In summary, the invention provides a hinge structure and an electronic device having the same. When the hinge structure thereof is relatively moved (closed or unfolded) under an external force, the plurality of pivots rotate synchronously with respect to a central axis through the features of the driving part, while the plurality of fixing parts may achieve the effects of synchronously moving away and synchronously approaching, driving the two carriers to be relatively far apart or close so as to prevent the drawbacks of moving unsmoothly of existing hinge structures, thereby preventing the flexible panel from being damaged during the unfolding or closing process.

Further, the invention employs an elastic support plate disposed between the two carriers and the fixing members and covering one side of the hinge structure, wherein the elastic support plate is used to support the flexible panel. When the flexible panel is bent, the elastic support plate may absorb a part of the torsional external force to improve the bending tolerance of the flexible panel so as to prevent the flexible panel from being damaged due to excessive bending.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A hinge structure comprising:
a plurality of pivots disposed parallel to one another;
a driving part disposed at a central portion of the pivots and perpendicular to the pivots;
two positioning gear sets respectively sleeved at both ends of each of the pivots; and
two pairs of fixing parts respectively disposed abut at both ends of the two positioning gear sets, wherein, when the fixing parts are under an external force, the positioning gear sets are relatively moved, and the driving part is configured to be folded and drives the pivots to rotate synchronously with respect to a central axis.

2. The hinge structure of claim 1, wherein the number of the pivots is an even number, and the driving part comprises the even number of synchronizing gears respectively sleeved on the pivots and engaged with one another.

3. The hinge structure of claim 2, wherein a distance of each of the synchronizing gears relative to one of the two positioning gear sets is equal to the distance of the each of the synchronizing gears relative to the other of the two positioning gear sets.

4. The hinge structure of claim 2, further comprising two rack bases respectively disposed abut at both ends of the two positioning gear sets and correspondingly located between the fixing parts, the synchronizing gears of the driving part respectively engage the rack bases.

5. The hinge structure of claim 4, wherein each of the fixing parts has a slide, the rack bases are respectively movably located between the fixing parts, and the synchronizing gears are configured to drive the rack bases to move along the slides.

6. The hinge structure of claim 4, further comprising an elastic support plate fixed on a side of the rack bases relatively distal from the synchronizing gears, the elastic support plate is presented as a folded state or a flat state corresponding to the driving part being folded or unfolded.

7. The hinge structure of claim 4, wherein the rack bases are integrally connected to the corresponding fixing parts respectively, and the synchronizing gears are adapted to drive the rack bases to synchronously move with the fixing parts.

8. The hinge structure of claim 7, further comprising an elastic support plate connected between the fixing parts and relatively distal from the synchronous gears, the elastic support plate has a plurality of collars respectively sleeved at the corresponding pivots, when the rack bases and the fixing parts are away from each other, the elastic support plate is presented as a bent state, and when the rack bases and the fixing parts are close to each other, the elastic support plate is presented as a flat state.

9. The hinge structure of claim 1, wherein the driving part comprises an elastic steel sheet disposed through the central portion of the pivots and parallel to the positioning gear sets.

10. The hinge structure of claim 1, further comprising at least two torsion components sleeved on the pivots and respectively located between the driving part and the two positioning gear sets.

11. An electronic device, comprising:
at least one hinge structure comprising:
a plurality of pivots disposed parallel to one another;
a driving part disposed at a central portion of the pivots and perpendicular to the pivots;
two positioning gear sets respectively sleeved at both ends of each of the pivots; and
two pairs of fixing parts respectively disposed abut at both ends of the two positioning gear sets;
a housing for carrying the at least one hinge structure;
two carriers respectively linked to the corresponding fixing parts; and
a flexible panel disposed on the two carriers;
wherein, when the fixing parts are under an external force, the positioning gear sets drive the two carriers to relatively move, and the driving part is configured to generate a folding to drive the pivots to rotate synchronously with respect to a central axis such that the flexible panel is relatively folded or relatively unfolded.

12. The electronic device of claim 11, wherein the number of the pivots is an even number, and the driving part comprises the even number of synchronizing gears respectively sleeved on the pivots and engaged with one another.

13. The electronic device of claim 12, wherein a distance of each of the synchronizing gears relative to one of the two positioning gear sets is equal to the distance of the each of the synchronizing gears relative to the other of the two positioning gear sets.

14. The electronic device of claim 12, wherein the at least one hinge structure further comprises two rack bases respectively disposed abut at both ends of the two positioning gear sets and correspondingly located between the fixing parts, the synchronizing gears of the driving part respectively engage the rack bases.

15. The electronic device as claimed in claim 14, wherein each of the fixing parts has a slide, the rack bases are respectively movably located between the fixing parts, and the synchronizing gears are configured to drive the rack bases to move along the slides.

16. The electronic device of claim 14, the at least one hinge structure further comprising an elastic support plate fixed on a side of the rack bases relatively distal from the synchronizing gears, the two carriers respectively disposed at both of a left side and a right side of the elastic support plate distal from the central axis.

17. The electronic device of claim 14, wherein the rack bases are integrally connected to the corresponding fixing parts respectively, and the synchronizing gears are adapted to drive the rack bases to synchronously move with the fixing parts.

18. The electronic device of claim 17, wherein the at least one hinge structure further comprises an elastic support plate connected between the fixing parts and relatively distal from the synchronous gears, the elastic support plate has a plurality of collars respectively sleeved at the corresponding pivots, the two carriers respectively disposed on the corresponding rack bases and the fixing parts and respectively located at both of a left side and a right side of the elastic support plate distal from the central axis.

19. The electronic device of claim 11, wherein the driving part comprises an elastic steel sheet disposed through the central portion of the pivots and parallel to the positioning gear sets.

20. The electronic device of claim 11, the at least one hinge structure further comprises at least two torsion components sleeved on the pivots and respectively located between the driving part and the two positioning gear sets.

* * * * *